(12) United States Patent
Ziegler et al.

(10) Patent No.: US 12,016,120 B2
(45) Date of Patent: Jun. 18, 2024

(54) COMPUTING CARD SYSTEM WITH ACCESSIBLE INTERNAL LAYERS AND EDGE INTERCONNECTS FOR AN INFORMATION HANDLING SYSTEM

(71) Applicant: Dell Products L.P., Round Rock, TX (US)

(72) Inventors: Charles William Ziegler, Framingham, MA (US); Jason Charles Pritchard, Hopkinton, MA (US); Stephen Edward Strickland, Foxborough, MA (US)

(73) Assignee: Dell Products L.P., Round Rock, TX (US)

( * ) Notice: Subject to any disclaimer, the term of this patent is extended or adjusted under 35 U.S.C. 154(b) by 265 days.

(21) Appl. No.: 17/367,885

(22) Filed: Jul. 6, 2021

(65) Prior Publication Data
US 2023/0010249 A1 Jan. 12, 2023

(51) Int. Cl.
| | |
|---|---|
| H05K 1/00 | (2006.01) |
| H01R 12/72 | (2011.01) |
| H01R 12/73 | (2011.01) |
| H05K 1/11 | (2006.01) |
| H05K 5/02 | (2006.01) |
| H05K 1/14 | (2006.01) |
| H05K 1/18 | (2006.01) |

(52) U.S. Cl.
CPC ........... *H05K 1/117* (2013.01); *H01R 12/721* (2013.01); *H01R 12/737* (2013.01); *H05K 5/0286* (2013.01); *H01R 2201/06* (2013.01); *H05K 1/141* (2013.01); *H05K 1/181* (2013.01); *H05K 2201/094* (2013.01)

(58) Field of Classification Search
CPC ........ H05K 1/117; H05K 1/141; H05K 1/181; H05K 5/0286; H05K 2201/094; H01R 12/721; H01R 12/737; H01R 2201/06
USPC ........................................................ 361/679.4
See application file for complete search history.

(56) References Cited

U.S. PATENT DOCUMENTS

| | | | | |
|---|---|---|---|---|
| 6,024,587 | A * | 2/2000 | Garth | H05K 1/0218 439/101 |
| 6,368,129 | B1 * | 4/2002 | Wang | H01R 12/721 439/60 |
| 2006/0189175 | A1 * | 8/2006 | Kinsley | H05K 3/403 439/66 |
| 2020/0083623 | A1 * | 3/2020 | Huang | G06F 1/16 |
| 2022/0263259 | A1 * | 8/2022 | Murphy | H05K 1/141 |

FOREIGN PATENT DOCUMENTS

EP           2495830 A1 *   9/2012    ........... H01R 12/721

* cited by examiner

*Primary Examiner* — Zhengfu J Feng
(74) *Attorney, Agent, or Firm* — McDermott Will & Emery LLP

(57) ABSTRACT

A computing card for an information handling system, the computing card system including a computing card, including: a first side including: a first body surface, the first body surface including a first plurality of conductive pads configured to connect respectively with a first set of pins of a computing card receptacle; a first indented surface configured to connect with a second set of pins of the computing card receptacle; a first connecting surface defined between the first body surface and the first indented surface; a bottom surface; and a plurality of internal layers, wherein one or more of the internal layers are exposed at the first indented surface, and are connected to the bottom surface.

9 Claims, 7 Drawing Sheets

COMPUTING CARD SYSTEM WITH ACCESSIBLE INTERNAL LAYERS AND EDGE INTERCONNECTS FOR AN INFORMATION HANDLING SYSTEM

BACKGROUND

Field of the Disclosure

The disclosure relates generally to an information handling system, and in particular, a computing card system for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Card edge interfaces can play a role within many electrically and mechanically oriented product designs. A very common tradeoff when choosing a connector is the overall connector size versus the connector's current carrying capability. In many cases, when assessing a connector, a designer may want to decrease the overall connector size but increase or keep constant the current carrying capability per pin.

SUMMARY

Innovative aspects of the subject matter described in this specification may be embodied in a computing card for an information handling system, the computing card system including: a computing card, including: a first side including: a first body surface, the first body surface including a first plurality of conductive pads configured to connect respectively with a first set of pins of a computing card receptacle; a first indented surface configured to connect with a second set of pins of the computing card receptacle; a first connecting surface defined between the first body surface and the first indented surface; a bottom surface; and a plurality of internal layers, wherein one or more of the internal layers are exposed at the first indented surface, and are connected to the bottom surface.

Other embodiments of these aspects include corresponding systems, apparatus, and computer programs, configured to perform the actions of the methods, encoded on computer storage devices.

These and other embodiments may each optionally include one or more of the following features. For instance, the first indented surface is conductive. The bottom surface is conductive. The computing card further includes: a second side including: a second body surface, the second body surface including a second plurality of conductive pads configured to connect respectively with a third set of pins of the computing card receptacle; a second indented surface, wherein the second indented surface is conductive, the second indented surface configured to connect with a fourth set of pins of the computing card receptacle; and a second connecting surface defined between the second body surface and the second indented surface. The bottom surface is defined between the first indented surface and the second indented surface, the bottom surface configured to connect with a fifth set of pins of the computing card receptacle. One or more of the internal layers are exposed at one of the first indented surface and the second indented surfaces.

Particular implementations of the subject matter described in this specification can be implemented so as to realize one or more of the following advantages. For example, increasing power transfer capabilities of card edge connections without increasing dimensions of the card; and increasing signal integrity of differential signals at edge card interfaces.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
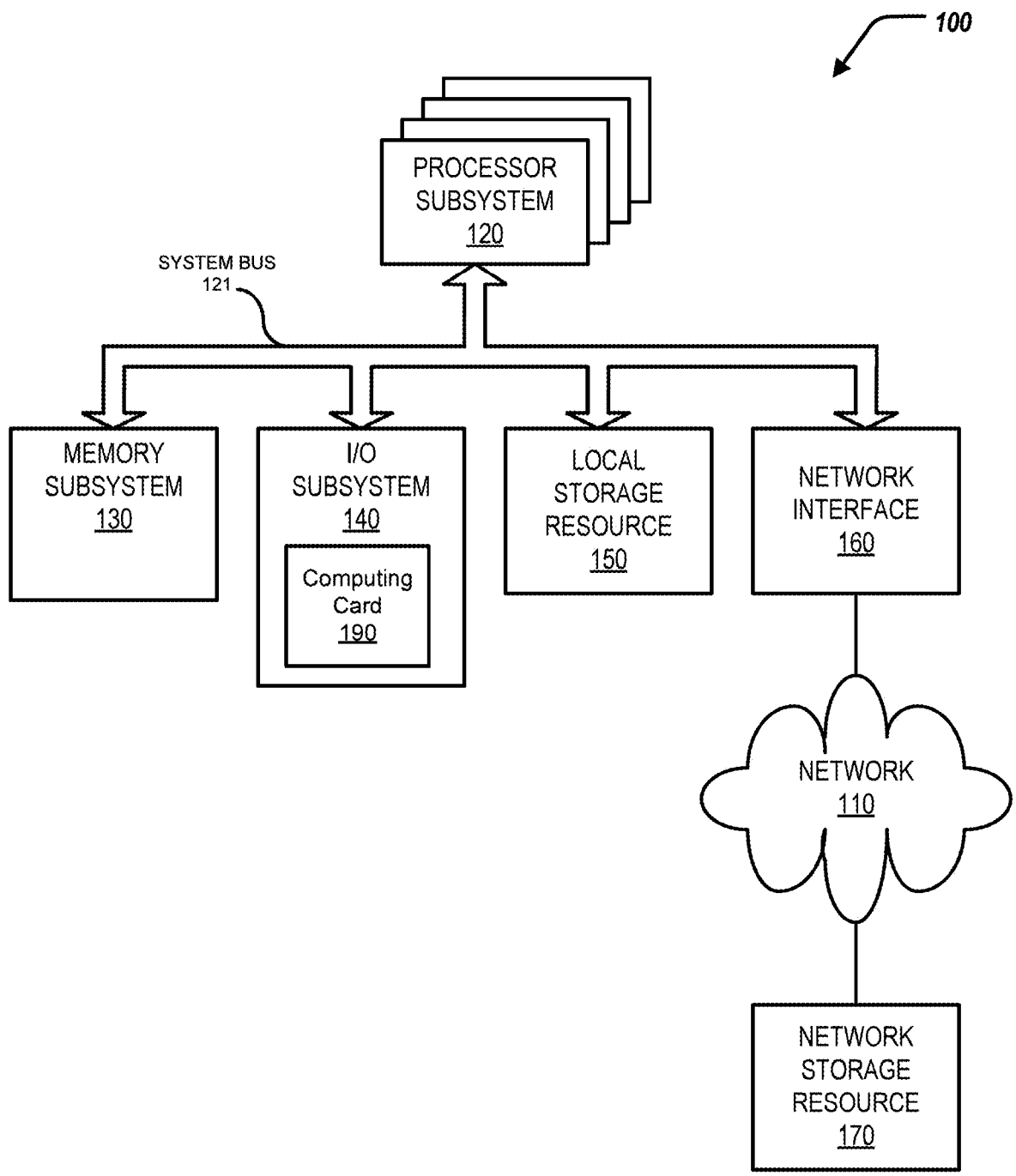
FIG. 1 is a block diagram of selected elements of an embodiment of an information handling system.

This disclosure discusses a computing card system for an information handling system. In short, direct contact between internal layers of a computing card and a receptacle of the computing card can be achieved, resulting in higher pin density and higher current capability, described further herein.

Specifically, this disclosure discusses a computing card system for an information handling system, the computing card system comprising: a printed circuit board, including: a first side including: a first body surface, the first body surface including a first plurality of conductive pads; a first indented surface, wherein the first indented surface is conductive; a first connecting surface defined between the first body surface and the first indented surface; a second side including: a second body surface, the second body surface including a second plurality of conductive pads; a second indented surface, wherein the second indented surface is conductive; a second connecting surface defined between the second body surface and the second indented surface; a bottom surface defined between the first indented surface and the second indented surface, wherein the bottom surface is conductive; a plurality of internal layers, wherein one or more of the internal layers are exposed at one of the first indented surface and the second indented surfaces, and are connected to the bottom conductive surface; a printed circuit board receptacle, the receptacle including: a plurality of pins, wherein when the printed circuit board is coupled to the receptacle: a first set of pins of the plurality of pins connect respectively with conductive pads of the first plurality of conductive pads; a second set of pins of the plurality of pins connect respectively with the first indented surface; a third set of pins of the plurality of pins connect respectively with conductive pads of the second plurality of conductive pads; a fourth set of pins of the plurality of pins connected respectively with the second indented surface; and a fifth set of pins of the plurality of pins connected with the bottom conductive surface.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-10 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

In some examples, the I/O subsystem 140 can include a computing card 190, described further herein.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, direct contact between internal layers of the computing card 190 and a receptacle of the computing card can be achieved, resulting in higher pin density and higher current capability, described further herein.

Figure 2:
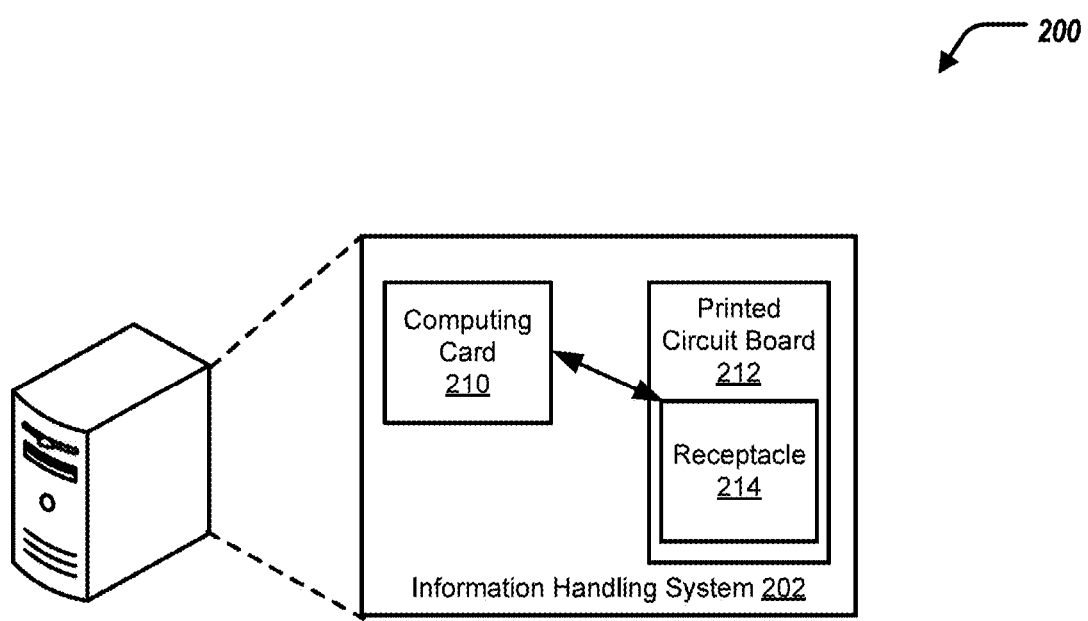
FIG. 2 illustrates a block diagram of an information handling system, including a computing card system for the information handling system.

Turning to FIG. 2, FIG. 2 illustrates an environment 200 including an information handling system 202. The information handling system 202 can include a computing card 210 and a printed circuit board (PCB) 212. The PCB 212 can include a computing card receptacle 214. In some examples, the PCB 212 can include a cable, or be considered a cable. In some examples, the information handling system 202 is similar to, or includes, the information handling system 100 of FIG. 1. In some examples, the computing card 210 is similar to, or includes, the computing card 190 of FIG. 1.

Figure 3A:
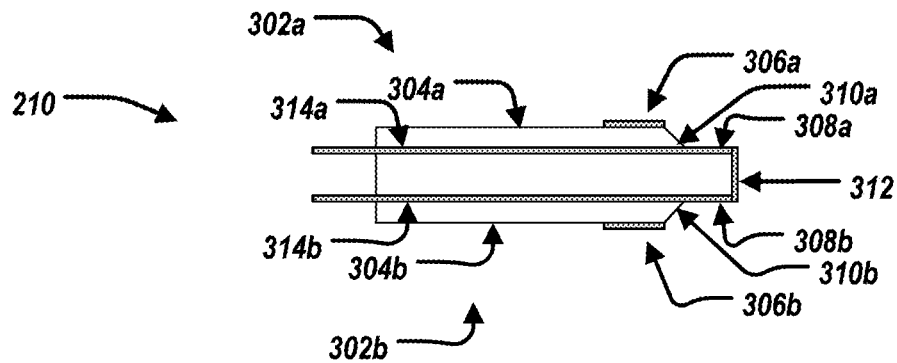
FIG. 3A illustrates a side view of a computing card, in a first embodiment.
Figure 3B:
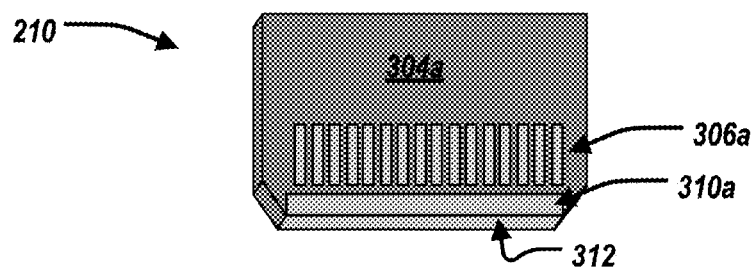
FIG. 3B illustrates a front (or rear) view of the computing card, in a first embodiment.

FIG. 3A illustrates a side view of the computing card 210, and FIG. 3B illustrates a front view of the computing card 210. The computing card 210 can include a first side 302a, and a second side 302b. The first side 302a can be positioned opposite to the second side 302b. The first side 302a can include a first body surface 304a. The first body surface 304a can include a plurality of conductive pads 306a. The first side 302a can further include a first indented surface 308a. In some examples, the first indented surface 308a is conductive. The first side 302a can further include a first connecting surface 310a. The first connecting surface 310a is defined between the first body surface 304a and the first indented surface 308a. The first connecting surface 310a is conductive.

The second side 302b can include a second body surface 304b. The second body surface 304b can include a plurality of conductive pads 306b. The second side 302b can further include a second indented surface 308b. In some examples, the second indented surface 308b is conductive. The second side 302b can further include a second connecting surface 310b. The second connecting surface 310b is defined between the second body surface 304b and the second indented surface 308b The second connecting surface 310b is conductive.

The computing card 210 can further include a bottom surface 312. The bottom surface 312 is defined between the first indented surface 308a and the second indented surface 308b. In some examples, the bottom surface 312 is conductive.

The computing card 210 can further include internal layers 314a, 314b (collectively referred to as internal layers 314). The computing card 210 can include any number of internal layers 314. For example, the computing card 210 can include 2 internal layers, 10 internal layers, or 24 internal layers. The internal layers 314 are conductive. One or more of the internal layers 314 can be exposed at the indented surfaces 308a, 308b. For example, the internal layer 314a is exposed at the indented surface 308a, and the internal layer 314b is exposed at the indented surface 308b.

In some examples, the internal layers 314 are selectively connected to the bottom surface 312. That is, one or more of the internal layers 314 can be connected to the bottom surface 312 at a time depending on the requirements and the application of the computing card 210.

In some examples, the indented surfaces 308a, 308b and the connecting surfaces 310a, 310b can be formed by milling, etching, and/or laser of the computing card 210 to expose the internal layer 314; for example, at the indented surfaces 308a, 308b.

Figure 4A:
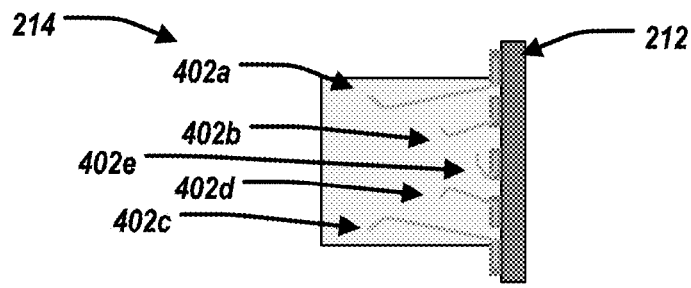
FIG. 4A illustrates a computing card receptacle, in a first embodiment.
Figure 4B:
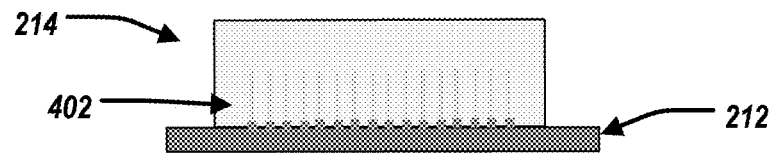
FIG. 4B illustrates a front view of the computing card receptacle, in a first embodiment.

FIG. 4A illustrates a side view the PCB 212 including the computing card receptacle 214; and FIG. 4B illustrates a front view of the PCB 212 including the computing card receptacle 214. The receptacle 214 can include a plurality of pins 402 that accept the computing card 210. Specifically, the receptacle 214 can include a first set of pins 402a that connect respectively with the conductive pads 306a; a second set of pins 402b that connect respectively with the first indented surface 308a; a third set of pins 402c that connect respectively with the conductive pads 306b; a fourth set of pins 402d that connect respectively with the second indented surface 308b; and a fifth set of pins 402e that connect with the bottom surface 312 (pins 402a, 402b, 402c, 402d, 402e collectively referred to as pins 402).

Figure 5A:
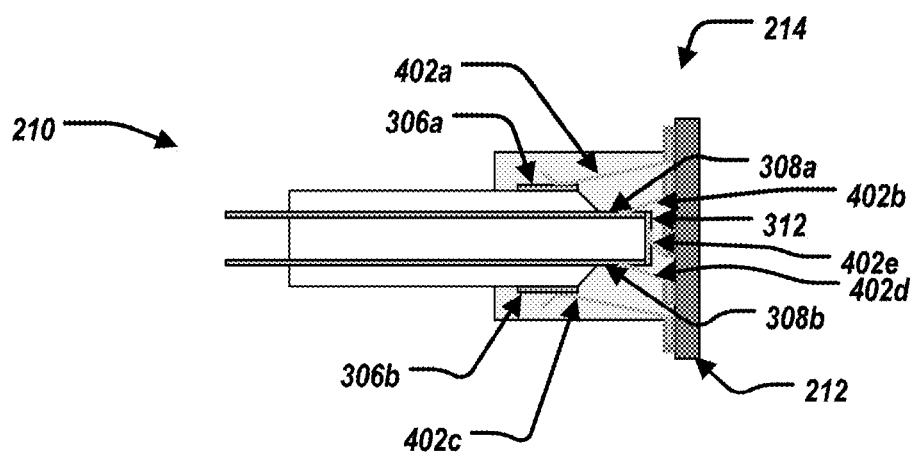
FIG. 5A illustrates a side view of the computing card system, in a first embodiment.
Figure 5B:
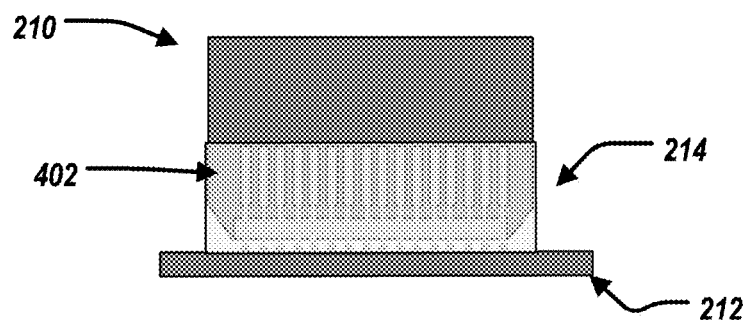
FIG. 5B illustrates a side view of the computing card system, in a first embodiment.

FIG. 5A illustrates a side view of the computing card 210 coupled with the receptacle 214; and FIG. 5B illustrates a front view of the computing card 210 coupled with the receptacle 214. Specifically, the conductive pads 306a are in contact with/connected with the pins 402a; the first indented surface 308a is in contact with/connected with the pins 402b; the conductive pads 306b are in contact with/connected with the pins 402c; the second indented surface 308b is in contact with/connected with the pins 402d; and the bottom surface 312 in contact with/connected with the pins 402e.

As a result of the coupling between the computing card 210 and the receptacle, in particular between the conductive pads 306, the indented surfaces 308, and the bottom surface 312 with the respective pins 402, a capability of the computing card 210 to transfer high current power is increased, a signal integrity of signals passing through the computing card 210 is increased, and/or a grounding capability of the computing card 210 is increased. In particular, the internal layers 314 are now accessible for transmission of such signals/data/power from the computing card 210 to the PCB 212 through the receptacle 214. The indented surfaces 308 and/or the bottom surface 312 can provide connection to the internal layers 314.

FIGS. 6-8 illustrate the computing card 210, the PCB 212, and the receptacle 214 in a further embodiment.

Figure 6A:
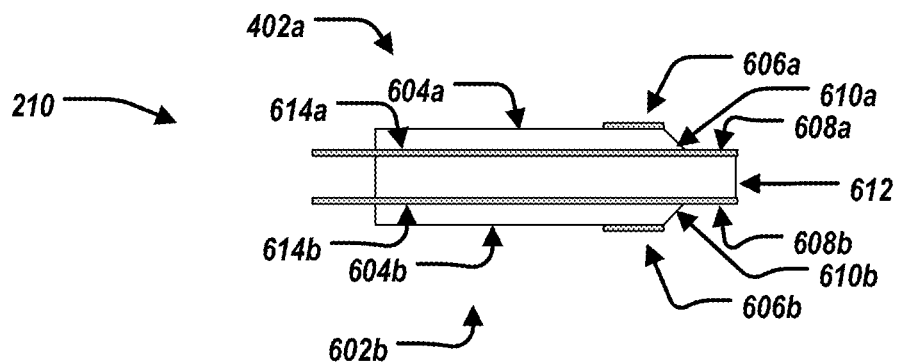
FIG. 6A illustrates a side view of the computing card, in a second embodiment.
Figure 6B:
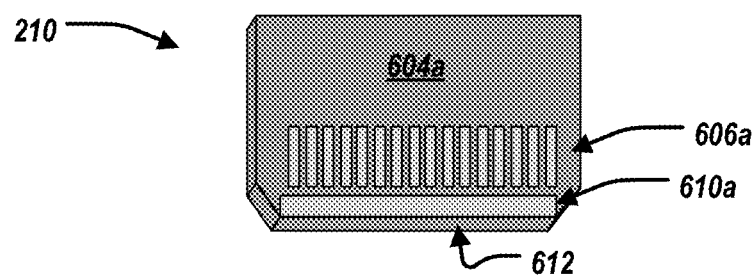
FIG. 6B illustrates a front (or rear) view of the computing card, in a second embodiment.

FIG. 6A illustrates a side view of the computing card 210, and FIG. 6B illustrates a front view of the computing card 210. The computing card 210 can include a first side 602a, and a second side 602b. The first side 602a can be positioned opposite to the first side 602b. The first side 602a can include a first body surface 604a. The first body surface 604a can include a plurality of conductive pads 606a. The first side 602a can further include a first indented surface 608a. In some examples, the first indented surface 608a is conductive. The first side 602a can further include a first connecting surface 610a. The first connecting surface 610a is defined between the first body surface 604a and the first indented surface 608a. In some examples, the first connecting surface 610a is conductive.

The second side 602b can include a second body surface 604b. The second body surface 604b can include a plurality of conductive pads 606b. The second side 602b can further include a second indented surface 608b. In some examples, the second indented surface 608b is conductive. The second side 602b can further include a second connecting surface 610b. The second connecting surface 610b is defined between the second body surface 604b and the second indented surface 608b. In some examples, the second connecting surface 610b is conductive.

The computing card 210 can further include a bottom surface 612. The bottom surface 612 is defined between the first indented surface 608a and the second indented surface 610b.

The computing card 210 can further include internal layers 614a, 614b (collectively referred to as internal layers 614). The computing card 210 can include any number of internal layers 614. For example, the computing card 210 can include 2 internal layers, 10 internal layers, or 24 internal layers. In some examples, the internal layers 614 are conductive. One or more of the internal layers 614 can be exposed at the indented surfaces 608a, 608b. For example, the internal layer 614a is exposed at the indented surface 608a, and the internal layer 614b is exposed at the indented surface 608b.

In some examples, the indented surfaces 608a, 608b and the connecting surfaces 610a, 610b can be formed by milling, etching, and/or laser of the computing card 210 to expose the internal layer 614; for example, at the indented surfaces 608a, 608b.

Figure 7A:
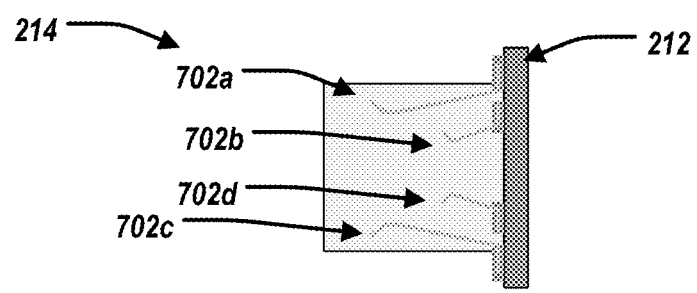
FIG. 7A illustrates the computing card receptacle, in a second embodiment.
Figure 7B:
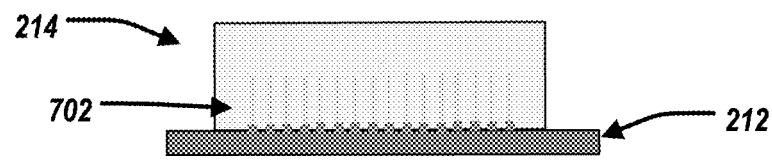
FIG. 7B illustrates a front view of the computing card receptacle, in a second embodiment.

FIG. 7A illustrates a side view the PCB 212 including the computing card receptacle 214; and FIG. 7B illustrates a front view of the PCB 212 including the computing card receptacle 214. The receptacle 214 can include a plurality of pins 702 that accept the computing card 210. Specifically, the receptacle 214 can include a first set of pins 702a that connect respectively with the conductive pads 606a; a second set of pins 702b that connect respectively with the first indented surface 608a; a third set of pins 702c that connect respectively with the conductive pads 606b; and a fourth set of pins 702d that connect respectively with the second indented surface 608b.

Figure 8A:
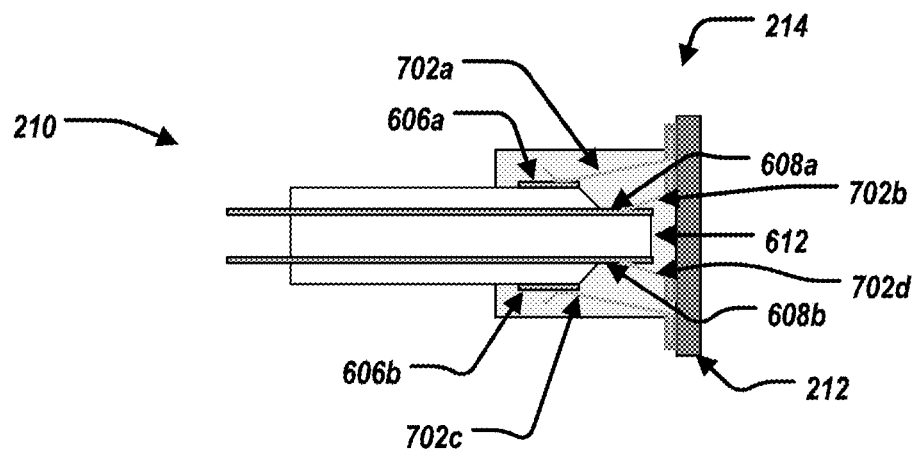
FIG. 8A illustrates a side view of the computing card system, in a second embodiment.
Figure 8B:
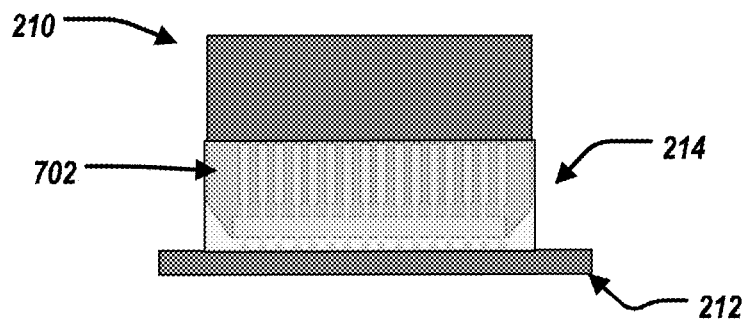
FIG. 8B illustrates a side view of the computing card system, in a second embodiment.

FIG. 8A illustrates a side view of the computing card 210 coupled with the receptacle 214; and FIG. 8B illustrates a front view of the computing card 210 coupled with the receptacle 214. Specifically, the conductive pads 606a are in contact with/connected with the pins 702a; the first indented surface 308a is in contact with/connected with the pins 702b; the conductive pads 606b are in contact with/connected with the pins 702c; and the second indented surface 608b is in contact with/connected with the pins 702d.

As a result of the coupling between the computing card 210 and the receptacle, in particular between the conductive pads 606, and the indented surfaces 608 with the respective pins 702, a capability of the computing card 210 to transfer high current power is increased, a signal integrity of signals passing through the computing card 210 is increased, and/or a grounding capability of the computing card 210 is increased. In particular, the internal layers 614 are now accessibly for transmission of such signals/data/power from the computing card 210 to the PCB 212 through the receptacle 214. The indented surfaces 608 can provide connection to the internal layers 614.

In the illustrated example of FIGS. 6-8, the internal layer 614 can be utilized as ground references.

Figure 9:
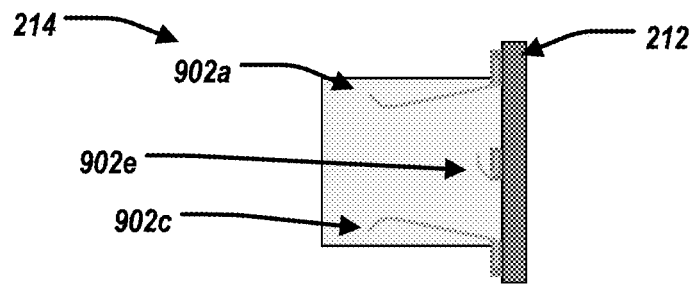
FIG. 9 illustrates a side view of the computing card receptacle, in a third embodiment.
Figure 10:
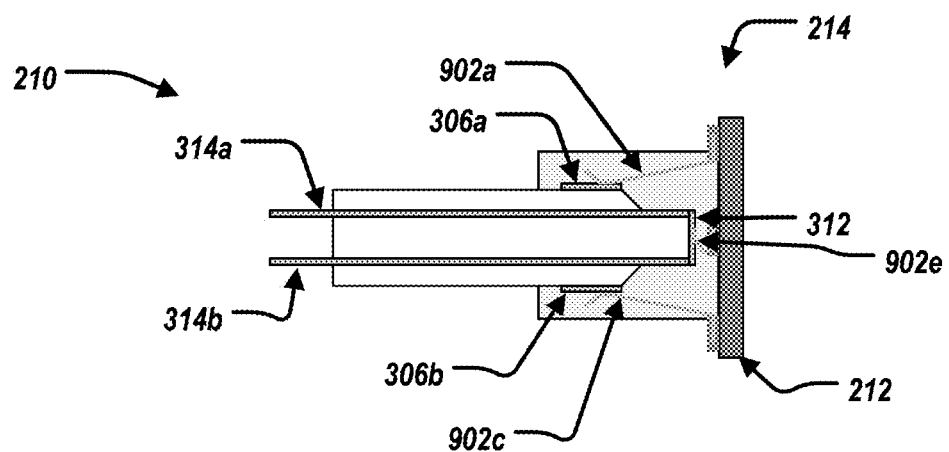
FIG. 10 illustrates a side view of the computing card system, in a third embodiment.

FIGS. 9, 10 illustrate the receptacle 214 in a further embodiment.

Specifically, FIG. 9 illustrates a side view the PCB 212 including the computing card receptacle 214. The receptacle 214 can include a plurality of pins 902 that accept the computing card 210. Specifically, the receptacle 214 can include a first set of pins 902a that connect respectively with the conductive pads 306a; a third set of pins 902c that connect respectively with the conductive pads 306b; and a fifth set of pins 402e that connect with the bottom surface 312 (pins 902a, 902c, 902e collectively referred to as pins 902).

FIG. 10 illustrates a side view of the computing card 210 coupled with the receptacle 214. Specifically, the conductive pads 306a are in contact with/connected with the pins 902a; the conductive pads 306b are in contact with/connected with the pins 902c; and the bottom surface 312 in contact with/connected with the pins 902e.

As a result of the coupling between the computing card 210 and the receptacle, in particular between the conductive pads 306, and the bottom surface 312 with the respective pins 902, a capability of the computing card 210 to transfer high current power is increased, a signal integrity of signals passing through the computing card 210 is increased, and/or a grounding capability of the computing card 210 is increased. In particular, the internal layers 314 are now accessibly for transmission of such signals/data/power from the computing card 210 to the PCB 212 through the receptacle 214. The bottom surface 312 can provide connection to the internal layers 314.

In the illustrated example of FIGS. 9 and 10, the internal layers 314 can be utilized to improve signal integrity of the computing card 210.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computing card system for an information handling system, the computing card system comprising:
    a computing card, including:
    a first side defined between a first edge and a second edge of the computing card, the second edge opposite to the first edge, the first side including:
        a first body surface, the first body surface including a first plurality of conductive pads connected respectively with a first set of pins of a computing card receptacle;
        a first indented surface connected with a second set of pins of the computing card receptacle;
        a first connecting surface defined between the first body surface and the first indented surface;
    a second side defined between the first edge and the second edge of the computing card, the second side of the computing card opposite to the first side of the computing card, the second side including:
        a second body surface, the second body surface including a second plurality of conductive pads connected respectively with a third set of pins of the computing card receptacle;
        a second indented surface, wherein the second indented surface is conductive, the second indented surface connected with a fourth set of pins of the computing card receptacle;
        a second connecting surface defined between the second body surface and the second indented surface;
    a conductive bottom surface defined between the first edge and the second edge, and between the first indented surface and the second indented surface; and
    a plurality of conductive internal layers, wherein a first and a second conductive internal layer of the conductive internal layers are exposed at the first indented surface and a third and a fourth conductive internal layer of the conductive internal layers are exposed at the second indented surface, wherein both the first conductive internal layer and the third conductive internal layer are connected to the conductive bottom surface and the second and the fourth conductive internal layer are not connected to the conductive bottom surface.

2. The computing card of claim 1, wherein the first indented surface is conductive.

3. The computing card of claim 1, wherein the conductive bottom surface is connected with a fifth set of pins of the computing card receptacle.

4. An information handling system, comprising:
    a processor;
    memory media storing instructions executable by the processor to perform operations;
    a computing card, including:

a first side including:
  a first body surface defined between a first edge and a second edge of the computing card, the second edge opposite to the first edge, the first body surface including a first plurality of conductive pads connected respectively with a first set of pins of a computing card receptacle;
  a first indented surface connected with a second set of pins of the computing card receptacle;
  a first connecting surface defined between the first body surface and the first indented surface;
a second side defined between the first edge and the second edge of the computing card, the second side of the computing card opposite to the first side of the computing card, the second side including:
  a second body surface, the second body surface including a second plurality of conductive pads connected respectively with a third set of pins of the computing card receptacle;
  a second indented surface, wherein the second indented surface is conductive, the second indented surface connected with a fourth set of pins of the computing card receptacle;
  a second connecting surface defined between the second body surface and the second indented surface;
a conductive bottom surface defined between the first edge and the second edge, and between the first indented surface and the second indented surface; and
a plurality of conductive internal layers, wherein a first and a second conductive internal layer of the conductive internal layers are exposed at the first indented surface and a third and a fourth conductive internal layer of the conductive internal layers are exposed at the second indented surface, wherein both the first conductive internal layer and the third conductive internal layer are connected to the conductive bottom surface and the second and the fourth conductive internal layer are not connected to the conductive bottom surface.

5. The information handling system of claim 4, wherein the first indented surface is conductive.

6. The information handling system of claim 4, wherein the conductive bottom surface configured to connect with a fifth set of pins of the computing card receptacle.

7. A computing card system for an information handling system, the computing card system comprising:
a computing card, including:
  a first side defined between a first edge and a second edge of the computing card, the second edge opposite to the first edge, the first side including:
    a first body surface, the first body surface including a first plurality of conductive pads;
    a first indented surface;
    a first connecting surface defined between the first body surface and the first indented surface;
  a second side defined between the first edge and the second edge of the computing card, the second side of the computing card opposite to the first side of the computing card, the second side including:
    a second body surface, the second body surface including a second plurality of conductive pads;
    a second indented surface, wherein the second indented surface is conductive,
    a second connecting surface defined between the second body surface and the second indented surface;
  a conductive bottom surface defined between the first edge and the second edge, and between the first indented surface and the second indented surface;
  a plurality of conductive internal layers, wherein a first and a second conductive internal layer of the conductive internal layers are exposed at the first indented surface and a third and a fourth conductive internal layer of the conductive internal layers are exposed at the second indented surface, wherein both the first conductive internal layer and the third conductive internal layer are connected to the conductive bottom surface and the second and the fourth conductive internal layer are not connected to the conductive bottom surface;
a computing card receptacle, the receptacle including:
  a plurality of pins, wherein when the computing card is coupled to the receptacle:
    a first set of pins of the plurality of pins connect respectively with the first plurality of conductive pads; and
    a second set of pins of the plurality of pins connect respectively with the first indented surface.

8. The computing card system of claim 7, wherein the first indented surface is conductive.

9. The computing card system of claim 7, wherein when the computing card is coupled to the receptacle:
a third set of pins of the plurality of pins connect respectively with the second plurality of conductive pads;
a fourth set of pins of the plurality of pins connected respectively with the second indented surface; and
a fifth set of pins of the plurality of pins connected with the conductive bottom surface.

* * * * *